(12) United States Patent
Park et al.

(10) Patent No.: US 11,177,315 B2
(45) Date of Patent: Nov. 16, 2021

(54) HIGH-RESOLUTION DISPLAY DEVICE

(71) Applicant: SAMSUNG ELECTRONICS CO., LTD., Suwon-si (KR)

(72) Inventors: Jinjoo Park, Yongin-si (KR); Hoyoung Ahn, Suwon-si (KR); Junhee Choi, Seongnam-si (KR); Sungjin Kang, Seoul (KR); Junghun Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 16/536,514

(22) Filed: Aug. 9, 2019

(65) Prior Publication Data

US 2020/0075665 A1   Mar. 5, 2020

(30) Foreign Application Priority Data

Sep. 5, 2018  (KR) .......................... 10-2018-0106044

(51) Int. Cl.
| | | |
|---|---|---|
| *H01L 27/15* | (2006.01) | |
| *H01L 33/42* | (2010.01) | |
| *H01L 33/14* | (2010.01) | |
| *H01L 33/50* | (2010.01) | |

(52) U.S. Cl.
CPC .......... *H01L 27/156* (2013.01); *H01L 33/145* (2013.01); *H01L 33/42* (2013.01); *H01L 33/504* (2013.01)

(58) Field of Classification Search
CPC .................................................... H01L 27/15
See application file for complete search history.

(56) References Cited

U.S. PATENT DOCUMENTS

2016/0336484 A1   11/2016   McGroddy et al.
2017/0179340 A1    6/2017   Chen et al.

FOREIGN PATENT DOCUMENTS

| KR | 10-1171356 B1 | 8/2012 |
|---|---|---|
| KR | 10-1797598 B1 | 11/2017 |
| KR | 10-2017-0132470 A | 12/2017 |

*Primary Examiner* — Marvin Payen
(74) *Attorney, Agent, or Firm* — Sughrue Mion, PLLC

(57) ABSTRACT

A high-resolution display device is provided. The high-resolution display device includes a light-emitting layer including a first semiconductor layer, an active layer, and a second semiconductor layer, a plurality of transparent electrodes respectively formed on the second semiconductor layer in sub-pixel regions, a first electrode connected to the first semiconductor layer, a plurality of second electrodes connected to the plurality of transparent electrodes, a color-converting layer arranged over the light-emitting layer and configured to emit light of a predetermined color based on light generated by the light-emitting layer, which are sequentially stacked on a substrate including a plurality of sub-pixel regions. One or more ion injection regions corresponding to current injection regions corresponding to the plurality of the sub-pixel regions is formed in the second semiconductor layer.

20 Claims, 5 Drawing Sheets

HIGH-RESOLUTION DISPLAY DEVICE

CROSS-REFERENCE TO RELATED APPLICATION

This application is based on and claims priority from Korean Patent Application No. 10-2018-0106044, filed on Sep. 5, 2018, in the Korean Intellectual Property Office, the disclosure of which is incorporated herein in its entirety by reference.

BACKGROUND

1. Field

The disclosure relates to display devices, and more particularly, to high-resolution display devices having increased optical efficiency and color quality.

2. Description of the Related Art

Liquid crystal displays (LCDs) and organic light-emitting diode (OLED) displays are widely used as display devices. Recently, techniques for manufacturing a high-resolution display device that is used in mobile devices, virtual reality, and augmented reality (AR) has drawn attention.

In a display device of the related art, a portion of an active layer is mesa-etched to control contrast through an optical separation between pixels (or sub-pixels). The mesa-etching may structurally damage a light-emitting layer, may reduce internal quantum efficiency by a leakage current in a mesa region, and light may be mainly generated in a limited area near the mesa region.

SUMMARY

Provided are high-resolution display devices in which a light emission region and current injection regions are defined by ion injection and in which a mesa-etching region for forming an electrode is reduced.

Additional aspects will be set forth in part in the description which follows and, in part, will be apparent from the description, or may be learned by practice of the presented embodiments.

According to an aspect of the disclosure, there is provided a high-resolution display device comprising: a substrate comprising a plurality of sub-pixel regions; a light-emitting layer comprising a first semiconductor layer, an active layer, and a second semiconductor layer sequentially stacked on the substrate; a plurality of transparent electrodes formed on the second semiconductor layer, each of the plurality of transparent electrodes formed in one of the plurality of sub-pixel regions; a first electrode connected to the first semiconductor layer; a plurality of second electrodes, each of the plurality of second electrodes connected to one of the plurality of transparent electrodes; a color-converting layer arranged over the light-emitting layer and configured to emit light of a specific color based on light generated by the light-emitting layer; and one or more ion injection regions formed in the second semiconductor layer corresponding to a plurality of current injection regions corresponding to the plurality of the sub-pixel regions.

The active layer may be continuously formed across the plurality of sub-pixel regions.

The one or more ion injection regions may vertically extend from an upper surface of the second semiconductor layer to the active layer.

The active layer may comprise the plurality of current injection regions surrounded by the one or more ion injection regions.

The first electrode may be connected to the first semiconductor layer through a via hole penetrating the plurality of second electrodes and the active layer.

The first electrode may correspond to the plurality of second electrodes.

The substrate may be a conductive substrate, and the first electrode may be located on a lower surface of the substrate to face the plurality of second electrodes.

The high-resolution display device may further comprise a buffer layer between the substrate and the first semiconductor layer.

The buffer layer may comprise AlN or AlGaN doped with silicon or magnesium.

The plurality of transparent electrodes may comprise indium tin oxide (ITO), ZnO, indium zinc oxide (IZO), or indium gallium zinc oxide (IGZO).

The high-resolution display device may further comprise a current blocking layer arranged on the ion injection region to insulate the second semiconductor layer from the one or more ion injection regions.

The current blocking layer may comprise silicon oxide or silicon nitride.

The high-resolution display device may further comprise: a first insulating layer arranged on the substrate to cover the second electrodes; and a barrier rib structure arranged on the first insulating layer with gaps to expose the plurality of current injection regions when viewed from a plan view, wherein the color-converting layer may fill the gaps in the barrier rib structure on the first insulating layer.

The barrier rib structure may comprise a metal thin film interposed between two insulating layers.

The light-emitting layer may generate blue light, and the color-converting layer may comprise a red-converting layer that emits red light by being excited by the blue light, a green-converting layer that emits green light by being excited by the blue light, and a blue-transmitting layer that transmits the blue light.

Each of the one or more ion injection regions may be formed between two adjacent current injections regions among the plurality of current injection regions.

The transparent electrodes may cover at least a portion of the current blocking layer in a plan view.

The one or more ion injection regions may vertically extend from an upper surface of the second semiconductor layer to an upper surface of the first semiconductor layer.

The first semiconductor layer may be directly formed on the active layer, and the active layer is directly formed on the second semiconductor layer sequentially stacked on the substrate.

According to another aspect of the disclosure, there is provided a high-resolution display device comprising: a substrate comprising a plurality of sub-pixel regions; a light-emitting layer comprising a first semiconductor layer, an active layer, and a second semiconductor layer sequentially stacked on the substrate; a plurality of transparent electrodes formed on the second semiconductor layer, each of the plurality of transparent electrodes formed in one of the plurality of sub-pixel regions; a color-converting layer arranged over the light-emitting layer and configured to emit light of a specific color based on light generated by the light-emitting layer; and one or more ion injection regions formed in the second semiconductor layer corresponding to a plurality of current injection regions corresponding to the plurality of the sub-pixel regions.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
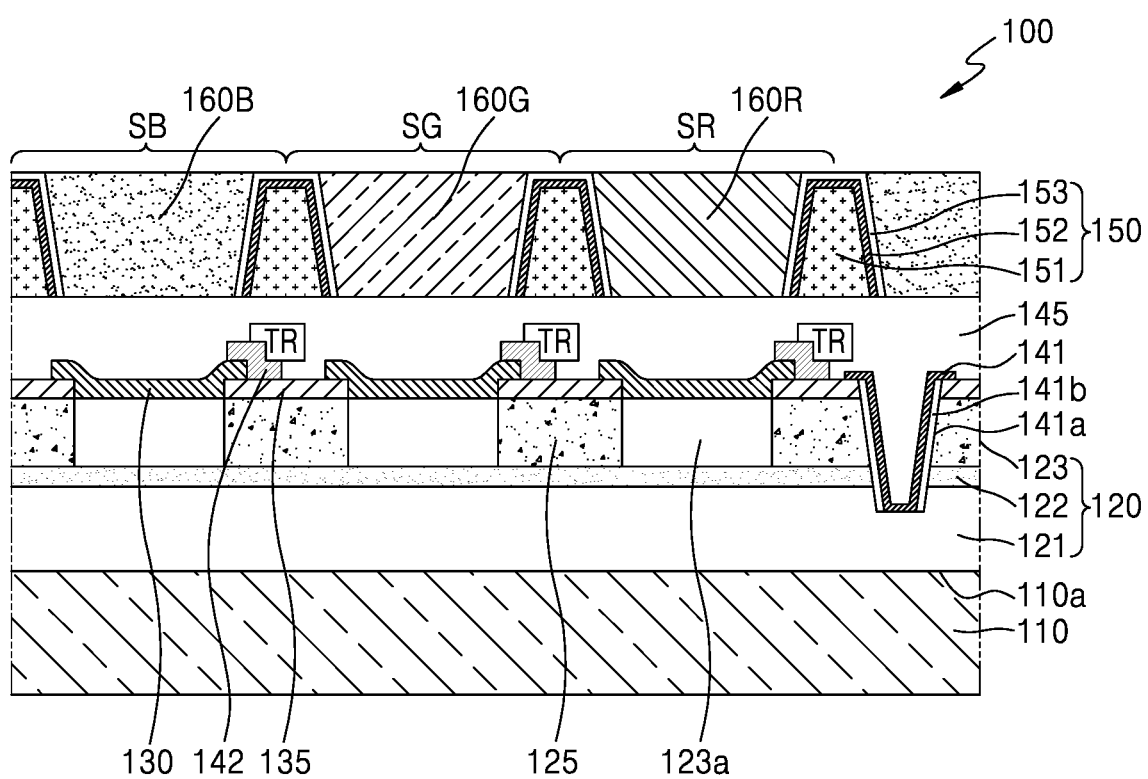
FIG. 1 is a schematic cross-sectional view of a high-resolution display device according to an embodiment.

Reference will now be made in detail to embodiments, examples of which are illustrated in the accompanying drawings. In the drawings, thicknesses of layers or regions are exaggerated for clarity of the specification. In this regard, the embodiments may have different forms and should not be construed as being limited to the descriptions set forth herein.

It will also be understood that when an element is referred to as being "on" or "above" another element, the element may be in direct contact with the other element or other intervening elements may be present.

Figure 2:
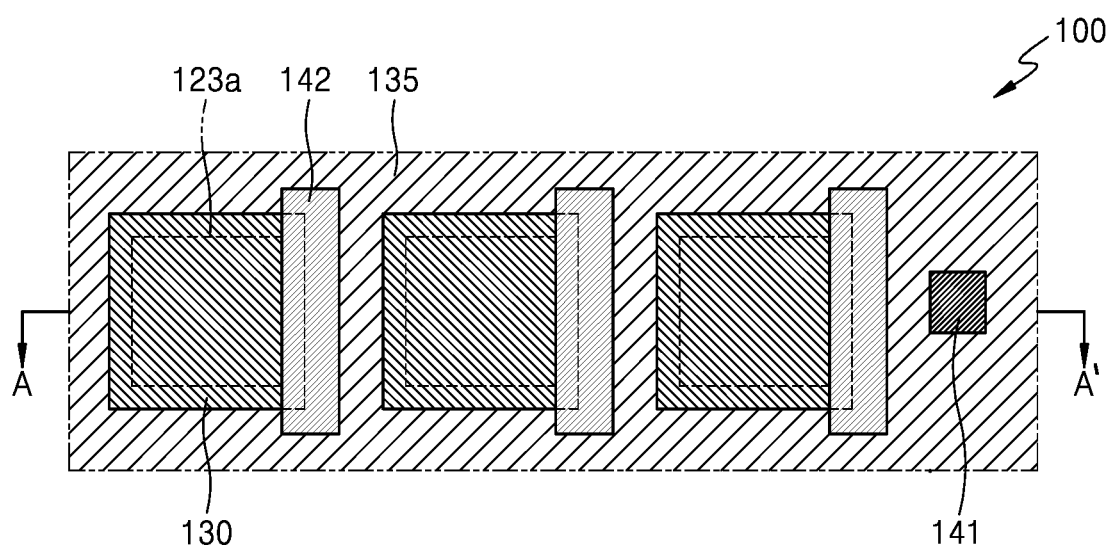
FIG. 2 is a schematic plan view of an electrode structure of a high-resolution display device according to an embodiment.
Figure 3:
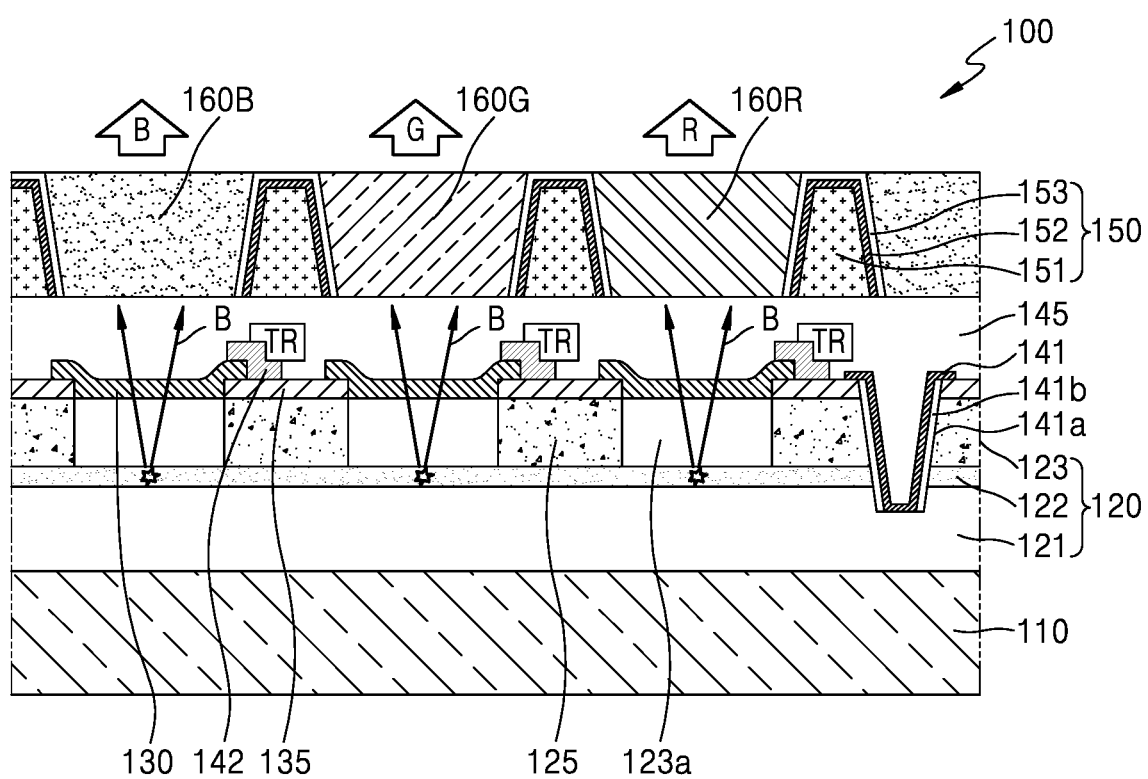
FIG. 3 is a schematic cross-sectional view for explaining an operation of a high-resolution display device according to an embodiment.

FIG. 1 is a schematic cross-sectional view of a high-resolution display device 100 according to an embodiment. FIG. 2 is a schematic plan view of an electrode structure of the high-resolution display device 100 according to an embodiment. FIG. 1 is a cross-sectional view taken along line A-A' of FIG. 2. FIG. 3 is a schematic cross-sectional view for explaining an operation of the high-resolution display device 100 according to an embodiment.

Referring to FIGS. 1 through 3, the high-resolution display device 100 includes a plurality of pixels. Each of the pixels may include a blue sub-pixel SB, a green sub-pixel SG, and a red sub-pixel SR. Each of the blue, green, and red sub-pixels SB, SG, and SR may be referred to as a sub-pixel region.

The high-resolution display device 100 may include a substrate 110, a light-emitting layer 120 on the substrate 110, and a plurality of color converting layers 160B, 160G, and 160R above the light-emitting layer 120.

The substrate 110 may be a substrate for growing the light-emitting layer 120 thereon. The substrate 110 may include substrates of various materials used in general semiconductor processes. For example, the substrate 110 may include a silicon substrate or a sapphire substrate. However, these are only examples, that is, the substrate 110 may include other various materials.

The light-emitting layer 120 that emits blue light B may be arranged on an upper surface 110a of the substrate 110. The light-emitting layer 120 may be a light-emitting diode (LED) layer including inorganic material. The light-emitting layer 120 may include a first semiconductor layer 121, an active layer 122, and a second semiconductor layer 123, which are sequentially grown on the upper surface 110a of the substrate 110. A buffer layer (not shown) for stably growing the light-emitting layer 120 may further be formed between the substrate 110 and the light-emitting layer 120. The buffer layer may include AlN, AlGaN, etc.

The first semiconductor layer 121 may be formed on the upper surface 110a of the substrate 110 or an upper surface of the buffer layer. The first semiconductor layer 121 may include, for example, an n-type semiconductor. However, the embodiment is not limited thereto. For example, the first semiconductor layer 121 may include a p-type semiconductor. The first semiconductor layer 121 may include a Group III-V n-type semiconductor, for example, n-GaN. The first semiconductor layer 121 may have a mono-layer structure or a multi-layer structure.

The active layer 122 may be arranged on an upper surface of the first semiconductor layer 121. The active layer 122 may emit blue light B. The active layer 122 may have a multi-quantum well (MQW) structure. The active layer 122 may include a Group III-V semiconductor, for example, GaN.

The second semiconductor layer 123 may be arranged on an upper surface of the active layer 122. The second semiconductor layer 123 may include a p-type semiconductor, but the embodiment is not limited thereto. For example, when the first semiconductor layer 121 is a p-type semiconductor, the second semiconductor layer 123 may include an n-type semiconductor. The second semiconductor layer 123 may include a Group III-V p-type semiconductor, for example, p-type GaN. The second semiconductor layer 123 may have a mono-layer structure or a multi-layer structure.

A first insulating layer 145 may be formed above the light-emitting layer 120. The color converting layers 160B, 160G, and 160R that emit lights of a specific color according to the blue light B emitted from the active layer 122 of the light-emitting layer 120 may be arranged on the first insulating layer 145. The color converting layers 160B, 160G, and 160R may include a blue-transmitting layer 160B, a green-converting layer 160G, and a red-converting layer 160R. The blue-transmitting layer 160B, the green-converting layer 160G, and the red-converting layer 160R respectively may be formed to correspond to a blue sub-pixel SB, a green sub-pixel SG, and a red sub-pixel SR.

The blue-transmitting layer 160B may transmit blue light B emitted from the active layer 122 and may emit it to the outside. The blue-transmitting layer 160B may include a photoresist or a light scattering agent.

The green-converting layer 160G may convert blue light B emitted from the active layer 122 to green light G and may emit it to the outside. The green-converting layer 160G may include quantum dots that are excited by blue light B and generate green light G. Also, the green-converting layer 160G may include a fluorescent substance that emits green light G by being excited by the blue light B emitted from the active layer 122. The green-converting layer 160G may further include a photoresist or a light scattering agent.

The quantum dots may have a core-shell structure having a core unit and a shell unit, and also, may have a particle structure without a shell. The core-shell structure may have a single-shell or a multi-shell. The multi-shell may be, for example, a double-shell.

The quantum dots may include at least one of Group II-VI based semiconductor, a Group III-V based semiconductor, a Group IV based semiconductor, and graphene quantum dots. In detail, the quantum dots may include at least one of Cd, Se, Zn, S, and InP, but the embodiment is not limited thereto. Each of the quantum dots may have a diameter of less than a few tens of nm, for example, approximately 10 nm or less.

The red-converting layer 160R may convert blue light B emitted from the active layer 122 to red light R and may emit it to the outside. The red-converting layer 160R may include quantum dots that are excited by blue light B and may generate red light R. The red-converting layer 160R may include phosphor that is excited by blue light B emitted from the active layer 122 and generates red light R. The red-converting layer 160R may further include a photoresist having a high transmission characteristic or a light scattering agent that uniformly emits the red light R.

Barrier rib structures 150 may be formed between the blue-transmitting layer 160B, the green-converting layer 160G, and the red-converting layer 160R. According to an embodiment, the barrier rib structures 150 may have gaps therebetween into which the blue-transmitting layer 160B, the green-converting layer and the red-converting layer 160R are filled. According to an embodiment, the barrier rib structures 150 may have a first barrier rib structure portion between the blue-transmitting layer 160B and the green-convertin layer 160G and a second barrier rib structure portion between the green-converting layer 160G and the red-converting layer 160R. The barrier rib structures 150 may be formed around the light-emitting region to define the light-emitting region. The barrier rib structures 150 may prevent light leak between the blue-transmitting layer 160B, the green-converting layer 160G, and the red-converting layer 160R. The barrier rib structures 150 may increase contrast by preventing cross-talk between the blue-transmitting layer 160B, the green-converting layer 160G, and the red-converting layer 160R. The barrier rib structures 150 respectively may include a second insulating layer 151, a reflection layer 152, and a third insulating layer 153. The second insulating layer 151 may be a sacrificial layer for the shape of the barrier rib structures 150. The second insulating layer 151 may include silicon oxide. The reflection layer 152 may include a metal, for example, aluminum. The third insulating layer 153 may prevent the oxidation of the reflection layer 152 and may insulate the reflection layer 152. The third insulating layer 153 may include silicon oxide.

An ion injection region 125 for preventing a current injecting into the second semiconductor layer 123 from dispersing to sides may be formed in the second semiconductor layer 123. The ion injection region 125 may be formed by injecting ions in the second semiconductor layer 123, such as nitrogen ions or boron ions and may have an insulating property. The ions may be injected to a dose of approximately $10^{12}$-$10^{20}$ ions/cm$^2$.

A current blocking layer 135 covering the ion injection region 125 may be formed on the second semiconductor layer 123. The current blocking layer 135 may prevent a current from leaking to other adjacent sub-pixels. The current blocking layer 135 may include silicon oxide or silicon nitride.

A plurality of transparent electrodes 130 may be formed on the second semiconductor layer 123. The transparent electrodes 130 may be formed to cover current injection regions 123a of the second semiconductor layer 123 surrounded by the ion injection region 125. According to an embodiment, as depicted in FIG. 2, the transparent electrodes 130 may cover some portions of the current blocking layer 135 while covering the second semiconductor layer 123. The transparent electrodes 130 may include indium tin oxide (ITO), ZnO, indium zinc oxide (IZO), indium gallium zinc oxide (IGZO), Ag, Au, etc.

A first electrode 141 electrically connected to the first semiconductor layer 121 and a plurality of second electrodes 142 electrically connected to the second semiconductor layer 123 may be arranged on the light-emitting layer 120.

When the first semiconductor layer 121 and the second semiconductor layer 123 respectively include an n-type semiconductor and a p-type semiconductor, the first electrode 141 and the second electrodes 142 respectively may be an n-type electrode and a p-type electrode.

The first electrode 141 may be a common electrode with respect to the sub-pixels SR, SG, and SB. In detail, a via hole 141a having a depth is formed to expose the first semiconductor layer 121 by sequentially etching the second semiconductor layer 123, the active layer 122, and the first semiconductor layer 121. The first electrode 141 may be a via metal provided to contact the first semiconductor layer 121 exposed through a via hole 141a. An insulating material 141b for insulating the first electrode 141 from the active layer 122 may be formed on a wall of the via hole 141a. According to an embodiment, the via hole 141a has a predetermined depth In FIG. 1, as an example, the first electrode 141 is depicted to commonly correspond to the three sub-pixels SR, SG, and SB. However, it is only an example, that is, the number of sub-pixels SR, SG, and SB commonly corresponding to the first electrode 141 may be variously changed. The first electrode 141 may include a highly conductive material.

The second electrodes 142 may be formed on the second semiconductor layer 123 to contact the transparent electrodes 130. Each second electrode 142 may be provided to contact a corresponding one of the sub-pixels SR, SG, and SB, that is, the color converting layers 160R, 160G, and 160B. The single first electrode 141 may be formed to correspond to the plurality of second electrodes 142.

A plurality of thin film transistors TR electrically connected to the second electrodes 142 are provided above the second semiconductor layer 123. The thin film transistors TR selectively drive at least one of the sub-pixels SR, SG, and SB of the plurality of sub-pixels SR, SG, and SB. The thin film transistors TR may be arranged under the barrier rib structures 150 so as not to interrupt light emitted from the active layer 122.

An operation of the high-resolution display device 100 according to an embodiment will be described with reference to FIG. 3. When a first voltage is applied to the first electrode 141 which is a common electrode and a second voltage is applied to the red sub-pixel SR by driving the thin film transistor TR connected to the red sub-pixel SR, blue light B is generated from the active layer 122 located under the red-converting layer 160R. When the emitted blue light B enters the red-converting layer 160R, the red-converting layer 160R emits red light R to the outside. The first voltage may be a first predetermined voltage, and the second voltage may be a second predetermined voltage.

When a third voltage is applied to the first electrode 141 which is a common electrode and a fourth voltage is applied to the green sub-pixel SG by driving the thin film transistor TR connected to the green sub-pixel SG, blue light B is generated from the active layer 122 located under the green-converting layer 160G. When the emitted blue light B enters the green-converting layer 160G, the green-converting layer 160G emits green light G to the outside. The third voltage may be a third predetermined voltage, and the fourth voltage may be a fourth predetermined voltage.

When a fifth voltage is applied to the first electrode 141 which is a common electrode and a sixth voltage is applied to the blue sub-pixel SB by driving the thin film transistor TR connected to the blue sub-pixel SB, blue light B is generated from the active layer 122 located under the selected blue-converting layer 160B. The generated blue light B is emitted to the outside transmitting through the blue-transmitting layer 160B. The fifth voltage may be a fifth predetermined voltage, and the sixth voltage may be a sixth predetermined voltage.

According to an embodiment, the first, second, third, fourth, fifth and sixth voltages may be a same voltage. According to another embodiment, one or more of the first, second, third, fourth, fifth and sixth voltages may be different voltages.

In the embodiment, as an example, it is depicted that blue light B, green light G, and red light R respectively are emitted to the outside from the blue-transmitting layer 160B, the green-converting layer 160G, and the red-converting layer 160R.

In the embodiment, blue light is emitted from the light-emitting layer 120, but the embodiment is not limited thereto. For example, the light-emitting layer 120 may be a layer that emits ultraviolet (UV) light, and the blue-transmitting layer 160B may be a blue-converting layer that generates blue light by receiving the UV light. The blue-converting layer may include quantum dots that emit blue light B by being excited by the UV light. A green-converting layer and a red-converting layer respectively may emit green light and red light by receiving the UV light.

According to the embodiment, the current injection regions 123a of the second semiconductor layer 123 that contacts the transparent electrodes 130 is surrounded by the ion injection region 125, and thus, a current injected from the transparent electrodes 130 may be prevented from dispersing to sides. Also, there is no mesa-etching process for separating sub-pixel regions, and thus, a current concentration on etched edges does not occur, and accordingly, light emission efficiency of a manufactured display device may be increased. Also, since a process for forming a via for the first electrode is reduced, a light emission area is increased, and accordingly, a high-resolution display device having a high light emission efficiency may be realized.

Figure 4:
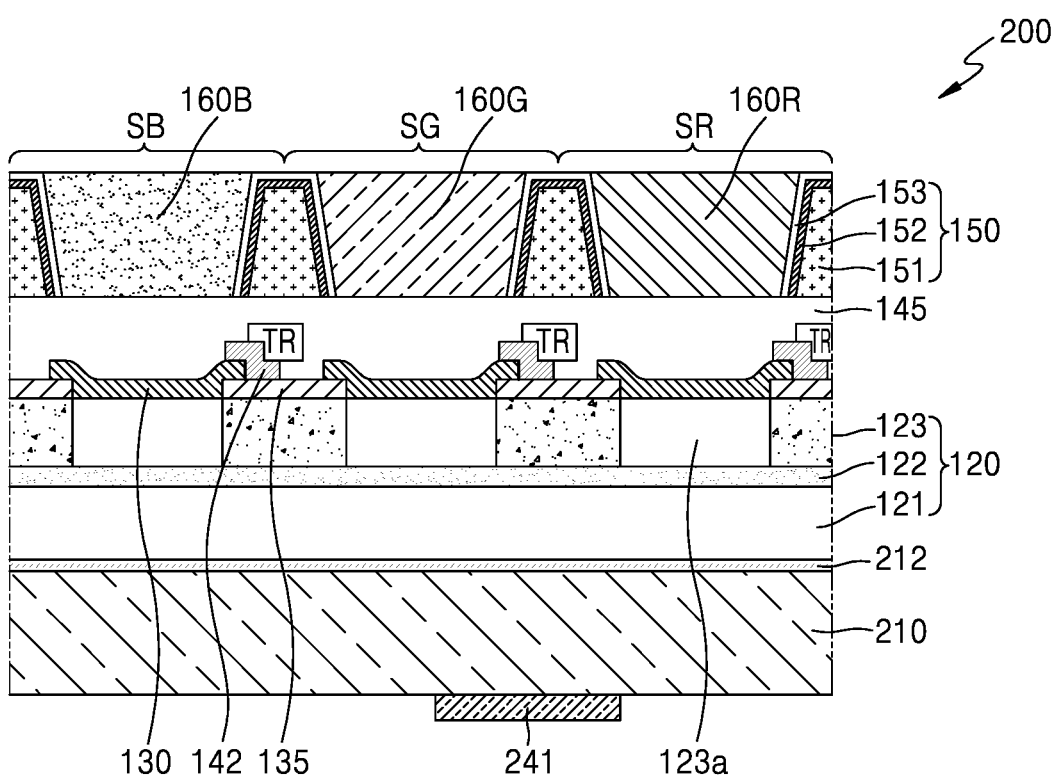
FIG. 4 is a schematic cross-sectional view of a high-resolution display device according to another embodiment.

FIG. 4 is a schematic cross-sectional view of a high-resolution display device 200 according to another embodiment. Like reference numerals are used to indicate elements that are substantially identical to the elements of FIGS. 1 and 2, and thus the detailed description thereof will not be repeated.

The high-resolution display device 100 depicted in FIG. 1 is a horizontal type display device, and the high-resolution display device 200 in FIG. 4 may be a vertical type display device. When the high-resolution display device 200 is compared with the high-resolution display device 100, the location of a first electrode 241 is different the location of the first electrode 141. A substrate 210 may be a conductive substrate. For example, the substrate 210 may be a silicon substrate. A buffer layer 212 may be formed on the substrate 210. The buffer layer 212 facilitates stable growing of the light-emitting layer 120 on the substrate 210. The buffer layer 212 may include AlN, AlGaN, etc. The buffer layer 212 may be doped with silicon or magnesium.

The first electrode 241 may be formed on a lower surface of the substrate 210, but the embodiment is not limited thereto. For example, the first electrode 241 may be formed on a lower surface of the first semiconductor layer 121 in contact with the first semiconductor layer 121 by omitting the substrate 210. The first electrode 241 may be a common electrode. A sub-pixel to emit light may be selected by a thin film transistor TR.

The high-resolution display device 200 does not have the structure of the via hole 141a of the high-resolution display device 100, and thus, may have a relatively greater light-emitting region, thereby increasing light emission efficiency.

Figure 5:
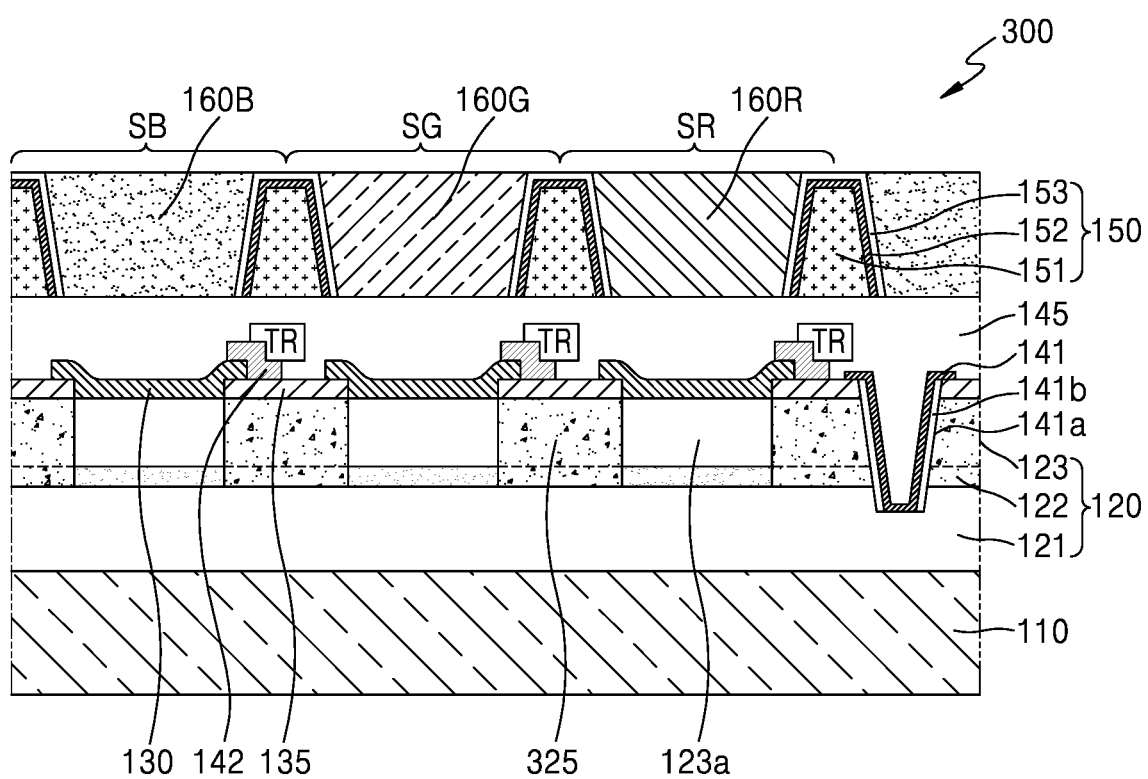
FIG. 5 is a schematic cross-sectional view of a high-resolution display device according to another embodiment.

FIG. 5 is a schematic cross-sectional view of a high-resolution display device 300 according to another embodiment. Like reference numerals are used to indicate elements that are substantially identical to the elements of FIGS. 1 and 2, and thus the detailed description thereof will not be repeated.

An ion injection region 325 of the high-resolution display device 300 is formed extending from the second semiconductor layer 123 to the active layer 122. Due to the vertical extension of the ion injection region 325, light is not generated in the active layer 122 at a boundary region between sub-pixel regions. Thus, a pixel isolation is well achieved and light generated from a corresponding sub-pixel region is prevented from travelling to adjacent sub-pixel regions. Therefore, color quality of the high-resolution display device 300 may be increased.

In the embodiment, the ion injection region 325 is formed in the second semiconductor layer 123 and the active layer 122, but the embodiment is not limited thereto. For example, the ion injection region may extend to the first semiconductor layer 121.

In the embodiment, the ion injection region 325 in the horizontal type high-resolution display device 300 is depicted, but the embodiment is not limited thereto. For example, in the vertical type high-resolution display device 200 of FIG. 4, the ion injection region may vertically extend from the second semiconductor layer to the active layer or the ion injection region may vertically extend from the second semiconductor layer to the active layer and the first semiconductor layer.

In the high-resolution display device 300 according to the embodiment, the ion injection region is vertically formed with respect to the light-emitting layer. Thus, a current injected from the transparent electrodes 130 may be prevented from dispersing to sub-pixels in adjacent regions. A mesa-etching process for separating the sub-pixel regions is not included, and thus, a current concentration on etched edges does not occur, and accordingly, light emission efficiency of the manufactured high-resolution display device may be increased. Therefore, a high-resolution display device having high light emission efficiency may be realized.

While one or more embodiments have been described with reference to the figures, it will be understood by those of ordinary skill in the art that various changes in form and details may be made therein without departing from the spirit and scope as defined by the following claims.

What is claimed is:
1. A high-resolution display device comprising:
   a substrate comprising a plurality of sub-pixel regions;
   a light-emitting layer comprising a first semiconductor layer, an active layer, and a second semiconductor layer sequentially stacked on the substrate;
   a plurality of transparent electrodes formed on the second semiconductor layer, each of the plurality of transparent electrodes formed in one of the plurality of sub-pixel regions;
   a first electrode connected to the first semiconductor layer;
   a plurality of second electrodes, each of the plurality of second electrodes connected to one of the plurality of transparent electrodes;

a color-converting layer arranged over the light-emitting layer and configured to emit light of a specific color based on light generated by the light-emitting layer; and one or more ion injection regions formed in the second semiconductor layer corresponding to a plurality of current injection regions corresponding to the plurality of the sub-pixel regions.

2. The high-resolution display device of claim 1, wherein the active layer is continuously formed across the plurality of sub-pixel regions.

3. The high-resolution display device of claim 1, wherein the one or more ion injection regions vertically extends from an upper surface of the second semiconductor layer to the active layer.

4. The high-resolution display device of claim 1, wherein the active layer comprises the plurality of current injection regions surrounded by the one or more ion injection regions.

5. The high-resolution display device of claim 1, wherein the first electrode is connected to the first semiconductor layer through a via hole penetrating the plurality of second electrodes and the active layer.

6. The high-resolution display device of claim 5, wherein the first electrode corresponds to the plurality of second electrodes.

7. The high-resolution display device of claim 1, wherein the substrate is a conductive substrate, and the first electrode is located on a lower surface of the substrate to face the plurality of second electrodes.

8. The high-resolution display device of claim 7, further comprising a buffer layer between the substrate and the first semiconductor layer.

9. The high-resolution display device of claim 8, wherein the buffer layer comprises AlN or AlGaN doped with silicon or magnesium.

10. The high-resolution display device of claim 1, wherein the plurality of transparent electrodes comprise indium tin oxide (ITO), ZnO, indium zinc oxide (IZO), or indium gallium zinc oxide (IGZO).

11. The high-resolution display device of claim 1, further comprising a current blocking layer arranged on the ion injection region to insulate the second semiconductor layer from the one or more ion injection regions.

12. The high-resolution display device of claim 11, wherein the current blocking layer comprises silicon oxide or silicon nitride.

13. The high-resolution display device of claim 1, further comprising:
a first insulating layer arranged on the substrate to cover the second electrodes; and a barrier rib structure arranged on the first insulating layer with gaps to expose the plurality of current injection regions when viewed from a plan view,
wherein the color-converting layer fills the gaps in the barrier rib structure on the first insulating layer.

14. The high-resolution display device of claim 13, wherein the barrier rib structure comprises a metal thin film interposed between two insulating layers.

15. The high-resolution display device of claim 1, wherein
the light-emitting layer generates blue light, and
the color-converting layer comprises a red-converting layer that emits red light by being excited by the blue light, a green-converting layer that emits green light by being excited by the blue light, and a blue-transmitting layer that transmits the blue light.

16. The high-resolution display device of claim 1, wherein each of the one or more ion injection regions is formed between two adjacent current injections regions among the plurality of current injection regions.

17. The high-resolution display device of claim 11, wherein the transparent electrodes cover at least a portion of the current blocking layer in a plan view.

18. The high-resolution display device of claim 1, wherein the one or more ion injection regions vertically extends from an upper surface of the second semiconductor layer to an upper surface of the first semiconductor layer.

19. The high-resolution display device of claim 1, wherein the first semiconductor layer is directly formed on the active layer, and the active layer is directly formed on the second semiconductor layer sequentially stacked on the substrate.

20. A high-resolution display device comprising:
a substrate comprising a plurality of sub-pixel regions;
a light-emitting layer comprising a first semiconductor layer, an active layer, and a second semiconductor layer sequentially stacked on the substrate;
a plurality of transparent electrodes formed on the second semiconductor layer, each of the plurality of transparent electrodes formed in one of the plurality of sub-pixel regions;
a color-converting layer arranged over the light-emitting layer and configured to emit light of a specific color based on light generated by the light-emitting layer; and
one or more ion injection regions formed in the second semiconductor layer corresponding to a plurality of current injection regions corresponding to the plurality of the sub-pixel regions.

* * * * *